United States Patent
Yoshizaki et al.

(10) Patent No.: US 10,851,267 B2
(45) Date of Patent: Dec. 1, 2020

(54) POLISHING COMPOSITION

(71) Applicant: FUJIMI INCORPORATED, Kiyosu (JP)

(72) Inventors: Yukinobu Yoshizaki, Kiyosu (JP); Youhei Takahashi, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 16/294,817

(22) Filed: Mar. 6, 2019

(65) Prior Publication Data
US 2019/0276706 A1 Sep. 12, 2019

(30) Foreign Application Priority Data
Mar. 7, 2018 (JP) ................. 2018-041108

(51) Int. Cl.
| C09G 1/02 | (2006.01) |
| C09K 13/00 | (2006.01) |
| H01L 21/306 | (2006.01) |
| C09K 3/14 | (2006.01) |
| H01L 21/321 | (2006.01) |
| H01L 21/3105 | (2006.01) |

(52) U.S. Cl.
CPC .............. *C09G 1/02* (2013.01); *C09K 3/1409* (2013.01); *C09K 3/1436* (2013.01); *H01L 21/30625* (2013.01); *H01L 21/31055* (2013.01); *H01L 21/3212* (2013.01)

(58) Field of Classification Search
None
See application file for complete search history.

(56) References Cited

U.S. PATENT DOCUMENTS

| 2004/0134376 A1 | 7/2004 | Hirano | |
| 2006/0030243 A1* | 2/2006 | Nishimoto | ........... C09K 3/1463 451/41 |
| 2012/0080775 A1* | 4/2012 | Matsuda | ............... B24B 37/044 257/617 |
| 2013/0146804 A1 | 6/2013 | Mizuno | |
| 2013/0183889 A1 | 7/2013 | Yoneda | |
| 2013/0283704 A1 | 10/2013 | Yoneda | |
| 2014/0349484 A1* | 11/2014 | Yokota | ................ H01L 21/3212 438/693 |
| 2016/0009955 A1* | 1/2016 | Lan | ...................... C09K 3/1436 438/692 |
| 2016/0194538 A1* | 7/2016 | Mizoguchi | ........... C01F 17/206 451/36 |
| 2017/0081552 A1 | 3/2017 | Yamato | |

FOREIGN PATENT DOCUMENTS

| CN | 103119122 A | 5/2013 |
| CN | 103180101 A | 6/2013 |
| CN | 103270129 A | 8/2013 |
| CN | 106103640 A | 11/2016 |
| JP | 2004-123921 A | 4/2004 |
| JP | 2006-012969 A | 1/2006 |

\* cited by examiner

*Primary Examiner* — Shamim Ahmed
(74) *Attorney, Agent, or Firm* — Foley & Lardner LLP

(57) ABSTRACT

Polishing compositions are disclosed which contribute to improvement of level difference performance (in particular, erosion). The polishing composition used for polishing an object to be polished includes abrasive grains and a dispersing medium, wherein the abrasive grains have an average primary particle size of 40 nm or less, and the number of coarse particles having a particle size of 0.2 to 1,600 μm in the abrasive grains is 20,000 or less per 1 $cm^3$ of the polishing composition.

14 Claims, No Drawings

POLISHING COMPOSITION

CROSS-REFERENCE TO RELATED APPLICATION

The present application is based on the Japanese patent application No. 2018-041108 filed on Mar. 7, 2018, and a disclosed content thereof is incorporated herein as a whole by reference.

BACKGROUND

1. Technical Field

The present invention relates to a polishing composition.

2. Description of Related Arts

As LSI (Large Scale Integration) is highly integrated and has high performance, a new microfabrication technique has been developed. Chemical mechanical polishing (CMP) which is one method of LSI is a technique which is often used in planarization of an interlayer insulating film, metal plug formation, buried wiring (damascene wiring) formation in a LSI manufacturing process, and in particular, a multilayer wiring formation process.

Recently, as design rules are reduced, a technique required for device manufacture is getting stricter every year, and in a LSI semiconductor device, improvement of level difference performance is an important problem. Among them, suppression of erosion is essential to the improvement of level difference performance (for example, JP 2004-123921 A).

SUMMARY

Therefore, an object of the present invention is to provide a novel polishing composition which contributes to improvement of level difference performance (in particular, erosion).

An embodiment of the present invention for solving the above problem is a polishing composition used for polishing an object to be polished, including abrasive grains and a dispersing medium, wherein the abrasive grains have an average primary particle size of 40 nm or less, and the number of coarse particles having a particle size of 0.2 to 1,600 μm in the abrasive grains is 20,000 or less per 1 $cm^3$ of the polishing composition.

DETAILED DESCRIPTION

Hereinbelow, embodiments of the present invention will be described. However, the present invention is not limited to the following embodiments. In addition, unless otherwise stated, operation, physical properties, and the like are measured at room temperature (20 to 25° C.) and a relative humidity of 40 to 50% RH.

(Polishing Composition)

An embodiment of the present invention is a polishing composition used for polishing an object to be polished, including abrasive grains and a dispersing medium, wherein the abrasive grains have an average primary particle size of 40 nm or less, and the number of coarse particles having a particle size of 0.2 to 1,600 μm in the abrasive grains is 20,000 or less per 1 $cm^3$ of the polishing composition. By this configuration, a novel polishing composition which contributes to improvement of level difference performance (in particular, erosion) can be provided.

(Abrasive Grain)

The polishing composition of the present invention includes abrasive grains, wherein the abrasive grains have an average primary particle size of 40 nm or less, and the number of coarse particles having a particle size of 0.2 to 1,600 μm in the abrasive grains is 20,000 or less per 1 $cm^3$ of the polishing composition. According to the present invention, a novel polishing composition which contributes to improvement of level difference performance (in particular, erosion) can be provided. In addition, the erosion can be measured by the following method. An 8 inch SiN/P-TEOS pattern wafer is polished, and for a protrusion of the pattern, a SiN layer is shaved away until the P-TEOS layer is exposed, thereby forming a pattern surface composed of P-TEOS and SiN on the wafer. Next, in the obtained pattern surface, for a part having a line end space of 0.25 μm/0.25 μm, a height difference X (Å) of steps between a P-TEOS portion on a part without a wiring as a reference height and a P-TEOS portion on a wiring can be measured, using an atomic force microscope (AFM) (manufactured by AFM WA1300 Hitachi Kenki FineTech Co., Ltd.) as erosion.

As a kind of abrasive grains, for example, a metal oxide such as silica, alumina, zirconia, ceria, and titania can be included. Silica is preferred for efficiently exhibiting the desired effect of the present invention. The kind of silica exemplified as a preferred embodiment is not particularly limited, however, for example, colloidal silica, fumed silica, sol-gel silica, and the like can be included. Among them, colloidal silica is preferred.

In the polishing composition of the present invention, the abrasive grains have an average primary particle size of 40 nm or less. When the abrasive grains have an average primary particle size more than 40 nm, a desired effect of the present invention cannot be obtained. In an embodiment of the present invention, the average primary particle size of the abrasive grains is preferably 30 nm or less, more preferably 20 nm or less, and still more preferably 15 nm or less, and the average primary particle size may be also 13 nm or less, 12 nm or less, 11 nm or less, 10 nm or less, 9 nm or less, or 8 nm or less. In particular, the effect of suppressing erosion becomes significant, when the average primary particle size is 15 nm or less, 13 nm or less, or 11 nm or less.

In the polishing composition of the present invention, the average primary particle size of the abrasive grains is 1 nm or more. In the polishing composition of the present invention, the average primary particle size of the abrasive grains is 2 nm or more. In addition, in the polishing composition of the present invention, the average primary particle size of the abrasive grains is 3 nm or more. In the polishing composition of the present invention, the average primary particle size of the abrasive grains is 4 nm or more. In addition, in the polishing composition of the present invention, the average primary particle size of the abrasive grains is 5 nm or more. In addition, in the polishing composition of the present invention, the average primary particle size of the abrasive grains is 6 nm or more, the average primary particle size of the abrasive grains is 7 nm or more, the average primary particle size of the abrasive grains is 8 nm or more, the average primary particle size of the abrasive grains is 9 nm or more, or the average primary particle size of the abrasive grains is 10 nm or more. When a silicon nitride film is polished by the abrasive grains with such the average primary particle size, a polishing speed of the silicon nitride film can be improved. Incidentally, in the present invention, a method of measuring the average primary particle size of the abrasive grains follows the method described in the Examples.

In the polishing composition of the present invention, the number of particles having a particle size of 0.2 to 1,600 μm (hereinafter, also simply referred to as "coarse particles") in the abrasive grains is 20,000 or less per 1 $cm^3$ of the polishing composition. When the number of the coarse particles is more than 20,000 per 1 $cm^3$ of the polishing composition, the desired effect of the present invention cannot be obtained. In an embodiment of the present invention, the number of the coarse particles is preferably 10,000 or less, more preferably 8,000 or less, more preferably 6,000 or less, more preferably 4,000 or less, more preferably 3,500 or less, still more preferably 3,230 or less, still more preferably 3,000 or less, still more preferably 2,800 or less, still more preferably 2,500 or less, still more preferably 2,400 or less, still more preferably 2,300 or less, and still more preferably 2,200 or less per 1 $cm^3$ of the polishing composition. Particularly, when the number of the coarse particles is 3,230 or less, 3,000 or less, 2,800 or less, 2,500 or less, or 2,300 or less, the effect of suppressing erosion becomes significant. In addition, though not particularly limited, the lower limit is realistically 0 or more, 100 or more, or about 200 or more. In addition, in an embodiment of the present invention, considering a polishing speed of the silicon nitride film, it is preferred that the coarse particles are present to some extent, and also, it is preferred that for example, about 500 or more, about 1,000 or more, about 1,500 or more, or about 2,000 or more of coarse particles are present. Incidentally, in the present invention, a method of measuring a particle size of the coarse particles follows the method described in the Examples. In addition, in an embodiment of the present invention, 1,000 to 3,230 coarse particles are present per 1 $cm^3$ of the polishing composition. According to the embodiment as such, the effect of suppressing erosion becomes significant. In an embodiment of the present invention, 1,500 to 3,000 coarse particles are present per 1 $cm^3$ of the polishing composition. In an embodiment of the present invention, 2,000 to 2,300 coarse particles are present per 1 $cm^3$ of the polishing composition. According to the embodiment as such, the effect of suppressing erosion becomes significant.

In an embodiment of the present invention, the abrasive grains have an average secondary particle size of preferably 70 nm or less, more preferably 55 nm or less, more preferably 40 nm or less, more preferably 30 nm or less, more preferably 20 nm or less, or still more preferably 15 nm or less. In particular, when the average secondary particle size is 40 nm or less, 30 nm or less, 20 nm or less, or 15 nm or less, the effect of suppressing erosion becomes significant. In the polishing composition of the present invention, the abrasive grains have an average secondary particle size of 10 nm or more. In addition, in the polishing composition of the present invention, the abrasive grains have an average secondary particle size of 13 nm or more. In addition, in the polishing composition of the present invention, the abrasive grains have an average secondary particle size of 32 nm or more. In addition, in the polishing composition of the present invention, the abrasive grains have an average secondary particle size of 45 nm or more. In addition, in the polishing composition of the present invention, the abrasive grains have an average secondary particle size of 50 nm or more. In addition, in the present invention, a method of measuring the average secondary particle size of the abrasive grains follows the method described in the Examples.

In an embodiment of the present invention, in a particle size distribution of the abrasive grains in the polishing composition, obtained by a laser diffraction scattering method, a lower limit of a ratio between a particle diameter D90 when particle mass integrated from fine particles reaches 90% of total particle mass and a particle diameter D10 when particle mass integrated from fine particles reaches 10% of total particle mass (in the present specification, also simply referred to as "D90/D10") is preferably 1.3 or more, more preferably 1.4 or more, more preferably 1.5 or more, more preferably 1.6 or more, more preferably 1.7 or more, more preferably 1.8 or more, more preferably 1.9 or more, and still more preferably 2.0 or more. Particularly, when the lower limit of D90/D10 is 1.8 or more, the effect of suppressing erosion becomes significant. In an embodiment of the present invention, an upper limit of D90/D10 is preferably 5.0 or less, more preferably 4.0 or less, more preferably 3.0 or less, still more preferably 2.9 or less, still more preferably 2.8 or less, still more preferably 2.7 or less, still more preferably 2.6 or less, still more preferably 2.5 or less, still more preferably 2.4 or less, still more preferably 2.3 or less, and still more preferably 2.2 or less. Particularly, when the upper limit of D90/D10 is 2.3 or less or 2.2 or less, the effect of suppressing erosion becomes significant.

In an embodiment of the present invention, the abrasive grains have a negative zeta potential in an acidic region. According to the embodiment as such, the polishing speed to the object to be polished having a positive zeta potential in an acidic region can be increased.

In an embodiment of the present invention, the abrasive grains may be surface-modified. These abrasive grains can be obtained for example, by mixing a metal such as aluminum, titanium, or zirconium, or an oxide thereof with the abrasive grains and doping the mixture on a surface of the abrasive grains, or obtained by immobilizing an organic acid. Among them, the abrasive grains formed by immobilizing an organic acid on the surface are preferred. Among them, silica having an organic acid chemically bonded to the surface is preferred. By these embodiments, the abrasive grains are able to have a negative zeta potential in the acidic region. In an embodiment of the present invention, the organic acid is not particularly limited, however, sulfonic acid, carboxylic acid, phosphoric acid, or the like can be included, and sulfonic acid is preferred. In addition, the silica having an organic acid immobilized on the surface is formed by immobilizing an acid group derived from an organic acid (for example, a sulfo group, a carboxyl group, a phosphate group, and the like) on the surface of the silica by a covalent bond (in some cases, through a linker structure). Here, the linker structure refers to any structure interposed between the surface of the silica and the organic acid. Accordingly, the silica having an organic acid immobilized on the surface may be formed by immobilizing the acid group derived from an organic acid on the surface of the silica by a direct covalent bond or may be formed by a covalent bond through a linker structure. A method of introducing these organic acids on the surface of the silica is not particularly limited, and in addition to a method of introducing the organic acids in the state of having mercapto group or alkyl group or the like to the surface of silica and followed by performing oxidization with sulfonic acid or carboxylic acid, a method of introducing the organic acid group in the state in which a protection group is bonded to the organic acid group to the surface of the silica and followed by releasing the protection group, can be included.

As a specific synthesis method of silica having an organic acid immobilized on the surface, when a sulfonic acid which is a kind of organic acid is immobilized on the surface of the silica, the process can be carried out by, for example, a method described in "Sulfonic acid-functionalized silica through quantitative oxidation of thiol groups", Chem. Commun. 246-247 (2003). Specifically, a silane coupling agent having a thiol group such as 3-mercaptopropyltrimethoxysilane is coupled to silica and the thiol group is oxidized with hydrogen peroxide, thereby obtaining silica having a sulfonic acid immobilized on the surface. Colloidal silica having a sulfonic acid modified on the surface of the Example of the present invention can be prepared identically.

When a carboxylic acid is immobilized on the surface of the silica, the process can be carried out by, for example, a method described in "Novel Silane Coupling Agents Containing a Photo labile 2-Nitrobenzyl Ester for Introduction of a Carboxy Group on the Surface of Silica Gel", Chemistry Letters, 3, 228-229(2000). Specifically, a silane coupling agent including a photoreactive 2-nitrobenzyl ester is coupled to silica and light irradiation is performed, thereby obtaining the silica having a carboxylic acid immobilized on the surface.

In an embodiment of the present invention, the abrasive grains have a degree of association (average secondary particle size/average primary particle size) of preferably 1.6 or more, and more preferably 1.8 or more. In addition, in an embodiment of the present invention, the abrasive grains have a degree of association (average secondary particle size/average primary particle size) of preferably 4.5 or less, more preferably 3.0 or less, more preferably 2.7 or less, or still more preferably 2. 6 or less, and a degree of association may be also 2.5 or less, 2.4 or less, 2.3 or less, or 2.2 or less. Here, it is particularly preferred that the abrasive grains have an average primary particle size of 6 nm or more. According to the embodiment as such, the effect of the present invention can be efficiently exhibited.

In an embodiment of the present invention, a lower limit of a content of the abrasive grains in the polishing composition is preferably 0.01% by mass or more, more preferably 0.1% by mass or more, more preferably 0.5% by mass or more, more preferably 1.0% by mass or more, more preferably 1.5% by mass or more, and still more preferably 1.8% by mass or more. By having such the lower limit, when the silicon nitride film is polished, the polishing speed of the silicon nitride film can be improved.

In an embodiment of the present invention, an upper limit of a content of the abrasive grains in the polishing composition is preferably 30% by mass or less, more preferably 10% by mass or less, more preferably 5% by mass or less, more preferably 4% by mass or less, more preferably 3% by mass or less, more preferably 2.5% by mass or less, and still more preferably 2.2% by mass or less. By having such the upper limit, when the silicon nitride film is polished, an appropriate polishing speed of the silicon nitride film can be exerted. In an embodiment of the present invention, the content of the abrasive grains is 0.5 to 2.5% by mass. According to the embodiment as such, the appropriate number of abrasive grains is included in the polishing composition, thereby efficiently exhibiting the desired effect of the present invention.

(Dispersing Medium)

In the polishing composition of the present invention, a dispersing medium is used for dispersing each component constituting the polishing composition. As the dispersing medium, an organic solvent or water can be considered, and among them, it is preferred to include water.

From the viewpoint of contaminating the object to be polished or inhibiting the action of other components, it is preferred that the water does not contain impurities as much as possible. Specifically, pure water, ultra-pure water, or distilled water from which impurity ions are removed by an ion exchange resin, and then foreign matter is removed by passing through a filter is preferred.

(PH Adjusting Agent)

In an embodiment of the present invention, in particular, in order to adjust pH to an acidic or basic region, a pH adjusting agent may be included in the polishing composition.

In the present invention, the acidic region refers to pH less than 7, preferably pH 6 or less, more preferably pH 0.5 to 5, more preferably pH 1 to 4, and still more preferably pH 1.5 to 3.5. In addition, the neutral region in the present invention refers to pH 7. In addition, the basic region in the present invention refers to pH more than 7, preferably pH 9 to 13, and more preferably pH 10 to 12. Incidentally, a pH value in the present invention refers to a value measured under the conditions described in the Examples.

In an embodiment of the present invention, it is preferred that the polishing composition is adjusted to be acidic. According to the embodiment as such, when the silicon nitride film is polished, the polishing speed of the silicon nitride film can be improved.

A specific example of the pH adjusting agent for adjusting pH to the acidic region may be any one of an inorganic compound and an organic compound, and, for example, inorganic acids such as sulfuric acid, nitric acid, boric acid, carbonic acid, hypophosphorous acid, phosphorous acid, and phosphoric acid; organic acids, for example, carboxylic acid such as citric acid, formic acid, acetic acid, propionic acid, benzoic acid, salicylic acid, glyceric acid, oxalic acid, malonic acid, succinic acid, maleic acid, phthalic acid, malic acid, tartaric acid, and lactic acid, and organic sulfuric acids such as methane sulfonic acid, ethane sulfonic acid, isethionic acid, and the like can be included. In addition, a divalent or higher acid of the above acid (for example, sulfuric acid, carbonic acid, phosphoric acid, oxalic acid, and the like) maybe in the state of a base when one or more protons ($H^+$) can be released. Specifically, for example, ammonium hydrogen carbonate or ammonium hydrogen phosphate is preferred (any kind of counter cation is basically fine, but weak base cation (ammonium, triethanolamine, or the like) is preferred).

As a specific example of the pH adjusting agent for adjusting pH to a basic region may be any one of an inorganic compound and an organic compound, and a hydroxide of an alkali metal or a salt thereof, quaternary ammonium, quaternary ammonium hydroxide or a salt thereof, ammonia, amine, or the like can be included.

As a specific example of an alkali metal, potassium, sodium, or the like can be included. As a specific example of a salt, carbonate, hydrogen carbonate, sulfate, acetate, or the like can be included.

As a specific example of quaternary ammonium, tetramethylammonium, tetraethylammonium, tetrabutylammonium, or the like can be included.

As a specific example of quaternary ammonium hydroxide or a salt thereof, tetramethylammonium hydroxide, tetraethylammonium hydroxide, tetrabutylammonium hydroxide, or the like can be included.

(Other Components)

In the present invention, the polishing composition may further include known additives which can be used in the polishing composition, such as an oxidizing agent, a chelating agent, a water-soluble polymer, a surfactant, an antiseptic agent, or an antifungal agent, as needed, to the extent that the additives do not interfere the effect of the present invention. However, according to an embodiment of the present invention, the polishing composition is substantially free of an oxidizing agent. According to the embodiment as such, when the silicon nitride film is polished, the polishing speed of the silicon nitride film can be improved. In addition, the expression, "substantially free of" includes a concept of being included at 0.1% by mass or less in the polishing composition, in addition to a concept of being not included at all in the polishing composition.

(Object to be Polished)

In an embodiment of the present invention, it is preferred that the object to be polished includes at least one film selected from the group consisting of a silicon oxide film, a silicon nitride film, a polysilicon film, a titanium nitride film, and a single-crystalline silicon. According to the embodiment as such, the desired effect of the present invention can be efficiently exhibited. In the embodiment of the present invention, it is preferred that the silicon oxide film is derived from tetraethyl orthosilicate (TEOS).

In an embodiment of the present invention, it is preferred that the polishing composition of the present invention is used for the object to be polished including a silicon nitride film; and at least one of a silicon oxide film and a polysilicon film. Accordingly, in a preferred embodiment of the present invention, the object to be polished includes a silicon nitride film; and at least one of a silicon oxide film and a polysilicon film. The embodiment as such has a technical effect in that the polishing speed of the silicon nitride film with respect to at least one of the silicon oxide film and the polysilicon film can be increased. In the polishing composition of the present invention, those having the average primary particle size of a specific particle size or less, and the specific number or less of coarse particles in the polishing composition are used, as the abrasive grains. When the abrasive grains have the average primary particle size of particularly 15 nm or less, 11 nm or less, 10 nm or less, 9 nm or less, or 8 nm or less, the polishing speed of the silicon nitride film with respect to at least one of the silicon oxide film and the polysilicon film can be significantly increased. In addition, when the number of coarse particles in the polishing composition is 3,230 or less, 3,000 or less, 2,800 or less, 2,500 or less, 2,400 or less, 2,300 or less, or 2,200 or less (in some cases, 1,500 or more or 2,000 or more), the polishing speed of the silicon nitride film with respect to at least one of the silicon oxide film and the polysilicon film can be significantly increased, thereby realizing suppression of erosion. In the embodiment as such, a surprising effect of realizing control of a selection ratio and erosion suppression just by adjusting the average primary particle size of the abrasive grains and the number of coarse particles is expressed, even in the case that a separate additive is not added into the polishing composition.

In an embodiment of the present invention, the separate additive may be added to the polishing composition. As the additive, an aqueous additive is preferred. As the aqueous additive, a cationic polymer, an anionic polymer, a nonionic polymer, a cationic surfactant, an anionic surfactant, a nonionic surfactant, a sugar alcohol, and the like are preferred. These additives may be used alone or in combination of two or more. These additives may be in the form of a salt.

As a specific example of these additives is preferably at least one selected from the group consisting of, for example, anionic modified polyvinyl alcohol, lauryl sulfate or the salt thereof (for example, a sodium salt), POE allylphenylether phosphate or the salt thereof (for example, an amine salt), sorbitol, lauryldimethylamine N-oxide, a naphthalene sulfonate formalin condensate, poly(meth)acrylic acid, polyvinylpyrrolidone (PVP), dextrin, polyvinyl alcohol (PVA), POE sorbitan monooleate, and polyglycerin.

In an embodiment of the present invention, when a polymer (including a polymer of sugar alcohols) is used as the aqueous additive, a lower limit of the weight average molecular weight is 1,000 or more, 1,100 or more, 1,200 or more, 1,300 or more, 1,350 or more, 1,400 or more, or 1,450 or more, in a preferred order. In addition, an upper limit of the weight average molecular weight is 10,000,000 or less, 5,000,000 or less, 2,000,000 or less, 1,000,000 or less, 500,000 or less, 100,000 or less, 10,000 or less, 5,000 or less, 2,500 or less, 2,000 or less, 1,800 or less, or 1,600 or less, in a preferred order. A method of measuring the weight average molecular weight follows the method described in the Examples. In an embodiment of the present invention, when the surfactant or the sugar alcohol which is nota polymer is used as the aqueous additive, the weight average molecular weight is usually less than 1000.

(Preparation Method of Polishing Composition)

A preparation method of the polishing composition of one embodiment of the present invention includes mixing the abrasive grains and the dispersing medium, wherein the abrasive grains have the average primary particle size of 40 nm or less, and the number of the coarse particles having a particle size of 0.2 to 1,600 μm in the abrasive grains is 20,000 or less per 1 cm$^3$ of the polishing composition. More specifically, for example, the preparation method includes mixing the abrasive grains and if necessary other components in the dispersing medium with stirring. Though a temperature when each component is mixed is not particularly limited, 10 to 40° C. is preferred, and heating may be performed for increasing a rate of dissolution. In addition, a mixing time is not particularly limited.

In an embodiment of the present invention, there is also no particular limitation on the method of preparing the abrasive grains having the average primary particle size of 40 nm or less and the number of the coarse particles of a particle size of 0.2 to 1,600 μm in the abrasive grains being 20,000 or less per 1 cm$^3$ of the polishing composition, however, for example, the abrasive grains can be obtained by a method of performing filtration with a depth type filter having a filtration precision of 0.2 μm, whose material and core are made of polypropylene. As the filter, for example, 254L-SLF-002EF manufactured from ROKI TECHNO CO., LTD., or the like is preferred. According to one embodiment of the present invention, when producing the polishing composition of one embodiment of the present invention, a confirmation step to determine whether the coarse particles have a predetermined numerical value (or a predetermined numerical range) may be included.

(Polishing Method)

In the present invention, a polishing method in which the object to be polished is polished by using the polishing composition, or a polishing method which includes obtaining a polishing composition by the preparation method and using the polishing composition is also provided.

As a polishing apparatus, a general polishing apparatus can be used, which mounts a holder holding a substrate or the like having the object to be polished or the like and a motor which can change the number of revolutions and has a platen to which a polishing pad (polishing cloth) can be attached.

As the polishing pad, a general nonwoven fabric, polyurethane, porous fluorine resin, and the like can be used without limitation. It is preferred that the polishing pad is groove-processed so that the polishing composition is accumulated in the groove.

The polishing condition is not particularly limited, and for example, a rotation speed of the platen is preferably 10 to 500 rpm, a rotation speed of a carrier is preferably 10 to 500 rpm, and pressure (polishing pressure) applied to the substrate having the object to be polished is preferably 0.1 to 10 psi. A method of supplying the polishing composition to the polishing pad is not particularly limited, and for example, a method of continuously supplying the composition with a pump or the like is adopted. Though a supply amount is not limited, it is preferred that the surface of the polishing pad is always covered with the polishing composition of the present invention.

(Manufacturing Method of Semiconductor Substrate)

In the present invention, a manufacturing method of a semiconductor substrate including the polishing method is provided. Since the manufacturing method of a semiconductor substrate of the present invention includes the polishing method, a semiconductor substrate having improved level difference performance, that is, realizing high flatness can be manufactured.

The embodiments of the present have been described in detail, however, they are illustrative and exemplary but not restrictive. It is clear that the scope of the present invention should be interpreted by the appended claims.

1. A polishing composition used for polishing an object to be polished, including abrasive grains and a dispersing medium,
wherein the abrasive grains have an average primary particle size of 40 nm or less, and
the number of coarse particles having a particle size of 0.2 to 1,600 μm in the abrasive grain is 20,000 or less per 1 cm$^3$ of the polishing composition.

2. The polishing composition as described in 1., wherein the abrasive grain has an average primary particle size of 15 nm or less.

3. The polishing composition as described in 1., wherein the abrasive grain has an average primary particle size of 11 nm or less.

4. The polishing composition as described in 1. to 3., wherein D90/D10 of the abrasive grain is 2.2 or less.

5. The polishing composition as described in any one of 1. to 4., wherein a content of the abrasive grain is 0.5 to 2.5% by mass.

6. The polishing composition as described in any one of 1. to 5., wherein the abrasive grain has a negative zeta potential in an acidic region.

7. The polishing composition as described in any one of 1. to 6., wherein the abrasive grain is formed by immobilizing an organic acid on a surface thereof.

8. The polishing composition as described in any one of 1. to 7., wherein the abrasive grain has a degree of association of 2.3 or less.

9. The polishing composition as described in any one of 1. to 8., wherein the composition has a pH of 1 to 4.

10. The polishing composition as described in any one of 1. to 9., wherein the composition is substantially free of an oxidizing agent.

11. The polishing composition as described in any one of 1. to 10., wherein the object to be polished includes at least one film selected from the group consisting of a silicon oxide film, a silicon nitride film, a polysilicon film, a titanium nitride film, and a single-crystalline silicon.

12. The polishing composition as described in any one of 1. to 11., wherein the object to be polished includes the silicon nitride film; and at least one of the silicon oxide film and the polysilicon film.

13. The polishing composition as described in any one of 1. to 12., further including at least one additive selected from the group consisting of a cationic polymer, an anionic polymer, a nonionic polymer, a cationic surfactant, an anionic surfactant, a nonionic surfactant, and a sugar alcohol.

14. A polishing method, including polishing an object to be polished using the polishing composition as described in any one of 1. to 13.

15. A manufacturing method of a semiconductor substrate, including the polishing method as described in 14.

EXAMPLES

The present invention will be described in more detail using the following Examples and Comparative Examples. However, the technical scope of the present invention is not limited only to the following Examples. In addition, in the following Examples, the operation was carried out under the condition of room temperature (25° C.) and a relative humidity of 40 to 50% RH, unless otherwise particularly stated.

<Preparation of Polishing Composition>

Examples 1 to 18 and Comparative Examples 1 to 4

Polishing compositions were prepared by mixing abrasive grains having an average primary particle size, an average secondary particle size, D90/D10, and the number of coarse particles described in Table 1 and Table 2; and maleic acid as a pH adjusting agent; and an additive (according to the Example or the Comparative Example) in a dispersing medium (pure water) so that the concentration of the abrasive grains is 2% by mass and pH is 2 (mixing temperature: about 25° C., mixing time: about 10 minutes). A content of the additive was 0.05 g per 1 kg of the polishing composition (when sorbitol was used as the additive, the content was 2g). In addition, (1) and (2) represent adding two kinds of additives. In addition, the weight average molecular weight was the weight average molecular weight (Mw) in terms of methyl polymethacrylate obtained by gel transmission chromatography (GPC) measurement.

Incidentally, the abrasive grains used in Examples 1, 2, 6-18 and Comparative Examples 3 and 4 were colloidal silica having sulfonic acid modified on the surface, and the abrasive grains used in Examples 3 to 5 and Comparative Examples 1 and 2 were colloidal silica which is not surface-modified.

Incidentally, the average primary particle size of the abrasive grains was calculated from a specific surface area of abrasive grains by BET method measured using "Flow SorbII 2300" manufactured by Micromeritics and density of abrasive grains. In addition, the average secondary particle size of the abrasive grains was calculated by a dynamic light scattering method measured using "UPA-UT151" manufactured by Microtrac.

In addition, the pH of the polishing composition (liquid temperature: 25° C.) was confirmed by a pH meter (manufactured by HORIBA, Ltd., model No.: LAQUA).

In addition, the number of the coarse particles (particle size of 0.2 μm or more and 1,600 μm or less) was measured as follows.

[Measurement Device/Measurement Condition]
(Measurement Device)
In-liquid particle measurement device (KS-41B: manufactured by RION CO., LTD.)
(Condition)
Data correction time: 60 sec
Sample dilution target: 2000 count/mL
Sample flow rate: 10 mL/min
<Polishing Performance Evaluation>
As an object to be polished,
200 mm wafer (TEOS (silicon oxide film)) and
200 mm wafer (SiN (silicon nitride film))
were prepared, each wafer was polished under the polishing condition as described below using the polishing composition obtained above, and a polishing rate was measured. In addition, a selection ratio was calculated. Here, TEOS refers to tetraethyl orthosilicate, and represents that the silicon oxide film is a silicon oxide film derived from tetraethyl orthosilicate.

(Polishing Condition)
Polishing machine: a CMP single side polishing machine for 200 mm wafer (MIRRA: manufactured by Applied Materials, Inc.)
Polishing pad: rigid foamed polyurethane pad (IC1010: manufactured by Rohm and Haas Company)
Pressure: 3 psi (about 20.7 kPa)
Number of revolutions of platen (polishing plate): 90 rpm
Number of revolutions of head (carrier): 87 rpm
Flow rate of polishing composition: 130 ml/min
Polishing time: for 1 minute.
(Polishing Rate)
A polishing rate (removal rate; R. R.) was calculated by the following equation.

$$\text{Polishing rate [Å/min]} = \frac{\text{Film thickness before polishing [Å]} - \text{Film thickness after polishing [Å]}}{\text{Polishing time [min]}} \quad \text{[Equation 1]}$$

A film thickness was obtained by a light interference type film thickness measurement apparatus (manufactured by KLA-Tencor, model No.: ASET), and evaluated by dividing the difference by a polishing time. The results are shown in Table 1 and Table 2.

(Selection Ratio)
The polishing rate (Å/min) of SiN (silicon nitride film) was divided by the polishing rate (Å/min) of TEOS (silicon oxide film) to calculate a selection ratio. The results are shown in Table 1 and Table 2.

(Erosion)
A silicon nitride/HDP pattern wafer having a diameter of 200 mm, including a portion composed of silicon nitride and a portion composed of high density plasma CVD silicon oxide (which is identical to the following SiN/P-TEOS pattern wafer) was polished under the above polishing conditions. For the pattern wafer after polishing, erosion (Å) in the region was measured using an atomic force microscope, in which a silicon nitride portion having a width of 0.25 μm is formed at intervals of 0.25 μm. The results are shown in Table 1 and Table 2.

More details are as follows.

For erosion, a 8 inch SiN/HDP pattern wafer having the following configuration was polished, and for a protrusion of the pattern, a SiN layer was polished away until an HDP layer is exposed, thereby forming a pattern surface composed of HDP and SiN on the wafer. The polishing conditions are as follows.

[8 Inch SiN/P-TEOS Pattern Wafer]
Specification
1st layer: a SiN which has a thickness of 700 Å (with pattern, the pattern corresponding to the 1st layer, a step difference of 600 Å),
2nd layer: an HDP which has a thickness of 1000 Å (with pattern, a step difference of 600 Å),
3rd layer: Bare-Si.
In addition, the 1st layer corresponds to the side of a polished surface.

Next, in the obtained pattern surface, for apart having a line end space of 0.25 μm/0.25 μm, a height difference X (Å) of steps between an HDP portion on a part without a wiring as a reference height and an HDP portion on a wiring can be measured, using an atomic force microscope (AFM) (manufactured by AFM WA1300 Hitachi Kenki FineTech Co., Ltd.) as erosion.

(Scratch)
Before measuring a scratch, a cleaning treatment process was performed. Details are as follows.

Each object to be polished which have been polished was cleaned by a cleaning method in which the each object is rubbed under the following conditions while applying pressure with sponge made of polyvinyl alcohol (PVA) as a cleaning brush, using ammonia water of about 0.05% was used.

Cleaning apparatus integrated type polishing apparatus: MirraMesa manufactured by Applied Materials, Inc.
Number of revolutions of cleaning brush: 100 rpm
Number of revolutions of object to be polished which have been polished: 50 rpm
Kind of composition for post-cleaning treatment: water (deionized water)
Supplied amount of composition for post-cleaning treatment: 1000 mL/min
Cleaning time: 60 seconds

[Evaluation of the Number of Scratches]
The number of scratches on the object to be polished which have been polished after the cleaning treatment was measured by SEM observation using Review SEM RS6000 manufactured by Hitachi, Ltd. First, in SEM observation, 100 defects present in the remaining part excluding the part having a width of 5 mm from an outer peripheral end portion on one side of the object to be polished which have been polished (the part from a width of 0 mm to a width of 5 mm, when the outer peripheral end portion is 0 mm) were sampled. Next, among the sampled 100 defects, particle residue was visually determined in SEM observation and the number of defects was checked, thereby calculating the ratio (%) of the particle residue in defects. Then, in the above-described evaluation of the number of defects, a product of the number of defects of 0.13 μm or more, measured using SP-2 manufactured by KLA TENCOR and a ratio of scratches (%) in the defects calculated from the SEM observation results was calculated as the number of scratches.

TABLE 1

|  | Type of silica | Average primary particle size (nm) | Average secondary particle size (nm) | Degree of association | D90/D10 | pH | The number of coarse particles | SiN R.R. (Å/min) | TEOS R.R. (Å/min) | Selection ratio | Erosion (Å) |
|---|---|---|---|---|---|---|---|---|---|---|---|
| Example 1 | Colloidal silica | 14.1 | 34 | 2.4 | 2.3 | 2.0 | 2725 | 585 | 15 | 39.00 | 10 |
| Example 2 | Colloidal silica | 35 | 61 | 1.7 | 1.7 | 2.0 | 18600 | 496 | 42 | 11.81 | 32 |
| Example 3 | Colloidal silica | 7 | 14 | 2.0 | 2.1 | 2.0 | 2111 | 601 | 8 | 75.125 | 5 |
| Example 4 | Colloidal silica | 12 | 53 | 4.4 | 3.6 | 2.0 | 1967 | 429 | 12 | 35.75 | 7 |
| Example 5 | Colloidal silica | 5 | 12 | 2.4 | 1.5 | 2.0 | 2351 | 149 | 44 | 3.39 | 24 |
| Comparative Example 1 | Colloidal silica | 90 | 211 | 2.3 | 2.0 | 2.0 | 3453033 | 619 | 152 | 4.07 | 120 |
| Comparative Example 2 | Colloidal silica | 142 | 207.1 | 1.5 | 1.4 | 2.0 | 2857921 | 383 | 262 | 1.46 | 250 |

TABLE 2

|  | Aqueous additive | Average primary particle size (nm) | Average secondary particle size (nm) | D90/D10 | Number of coarse particles | SiN R.R. (Å/min) | TEOS R.R. (Å/min) | Selection ratio | Scratches | Erosion (Å) |
|---|---|---|---|---|---|---|---|---|---|---|
| Example 6 | Sorbitol (Mw: 182) | 14.1 | 34 | 2.2 | 2432 | 551 | 15 | 36.59 | 72 | 9 |
| Example 7 | Anionic modified polyvinyl alcohol (Mw: 20000) | 14.1 | 34 | 2.2 | 3561 | 490 | 13 | 36.58 | 59 | 18 |
| Comparative Example 3 | Alkylamine | 14.1 | 72 | 7.8 | 168390 | 622 | 12 | 53.07 | 146 | 98 |
| Example 8 | Lauryl sulfate Na (Mw: 288) | 14.1 | 34 | 2.2 | 3223 | 484 | 13 | 36.13 | 58 | 9 |
| Example 9 | POE allylphenyletherphosphate amine salt | 14.1 | 36 | 2.4 | 4432 | 460 | 13 | 34.34 | 52 | 12 |
| Comparative Example 4 | Lauryldimethylamine N-oxide (Mw: 229) | 14.1 | 83 | 12 | 273869 | 550 | 13 | 41.08 | 89 | 122 |
| Example 10 | Naphthalene sulfonate formalin condensate (Mw: 1500) | 14.1 | 34 | 2.3 | 2932 | 430 | 13 | 32.10 | 52 | 9 |
| Example 11 | Polyacrylic acid (Mw: 10000) | 14.1 | 35 | 2.1 | 3235 | 454 | 13 | 33.89 | 56 | 13 |
| Example 12 | PVP (Mw: 40000) | 14.1 | 36 | 2.6 | 3892 | 464 | 13 | 34.62 | 45 | 13 |
| Example 13 | Dextrin (Mw: 300000) | 14.1 | 36 | 2.4 | 15698 | 538 | 13 | 40.13 | 68 | 14 |
| Example 14 | PVA (Mw: 10000) | 14.1 | 34 | 2.4 | 7945 | 531 | 13 | 39.64 | 75 | 22 |
| Example 15 | POE(20) sorbitan monooleate | 14.1 | 36 | 2.8 | 3948 | 550 | 15 | 35.93 | 69 | 17 |
| Example 16 | Poly(40)glycerin | 14.1 | 37 | 2.9 | 6754 | 543 | 14 | 38.79 | 66 | 21 |
| Example 17 | (1) Anionic modified polyvinyl alcohol (Mw: 20000) + (2) Sorbitol (Mw: 182) | 14.1 | 34 | 2.2 | 3320 | 512 | 14 | 36.57 | 44 | 16 |
| Example 18 | (1) Polyacrylic acid (Mw: 10000) + (2) poly(40)glycerin | 14.1 | 36 | 2.9 | 5985 | 503 | 14 | 35.93 | 60 | 17 |

POE(20) = the number of repeating units of polyoxyethylene being 20
PVP = polyvinylpyrrolidone
PVA = polyvinylalcohol
pH of the polishing composition of the Examples and the Comparative Examples shown in Table 2 was all 2.0.

What is claimed is:

1. A polishing composition used for polishing an object to be polished, comprising an abrasive grain and a dispersing medium,
wherein the abrasive grain has an average primary particle size of 15 nm or less, and
a number of coarse particles having a particle size of 0.2 to 1,600 μm in the abrasive grain is 20,000 or less per 1 cm$^3$ of the polishing composition.

2. The polishing composition according to claim 1, wherein the abrasive grain has an average primary particle size of 11 nm or less.

3. The polishing composition according to claim 1, wherein a ratio of a value of a particle diameter at 90% in the cumulative particle size distribution (D90) to a value of the particle diameter at 10% in the cumulative particle size distribution (D10) of the abrasive grain is 2.2 or less.

4. The polishing composition according to claim 1, wherein a content of the abrasive grain is 0.5 to 2.5% by mass.

5. The polishing composition according to claim 1, wherein the abrasive grain has a negative zeta potential in an acidic region.

6. The polishing composition according to claim 1, wherein the abrasive grain is formed by immobilizing an organic acid on a surface thereof.

7. The polishing composition according to claim 1, wherein the abrasive grain has a degree of association of 2.3 or less.

8. The polishing composition according to claim 1, wherein the composition has a pH of 1 to 4.

9. The polishing composition according to claim 1, wherein the composition is substantially free of an oxidizing agent.

10. The polishing composition according to claim 1, wherein the object to be polished includes at least one film selected from the group consisting of a silicon oxide film, a silicon nitride film, a polysilicon film, a titanium nitride film, and a single-crystalline silicon.

11. The polishing composition according to claim 1, wherein the object to be polished includes the silicon nitride film; and at least one of the silicon oxide film and the polysilicon film.

12. The polishing composition according to claim 1, further comprising: at least one additive selected from the group consisting of a cationic polymer, an anionic polymer, a nonionic polymer, a cationic surfactant, an anionic surfactant, a nonionic surfactant, and a sugar alcohol.

13. A polishing method, comprising polishing an object to be polished using the polishing composition according to claim 1.

14. A manufacturing method of a semiconductor substrate, comprising the polishing method according to claim 13.

* * * * *